United States Patent
Coggan et al.

(10) Patent No.: US 7,553,559 B2
(45) Date of Patent: Jun. 30, 2009

(54) HEXATRIENE DERIVATIVES FOR USE AS BLUE EMITTING MATERIALS FOR ORGANIC ELECTROLUMINESCENT DEVICES

(75) Inventors: Jennifer A. Coggan, Cambridge (CA); Hany Aziz, Oakville (CA)

(73) Assignee: LG Display Co., Ltd., Seoul (KR)

( * ) Notice: Subject to any disclaimer, the term of this patent is extended or adjusted under 35 U.S.C. 154(b) by 593 days.

(21) Appl. No.: 11/312,603

(22) Filed: Dec. 21, 2005

(65) Prior Publication Data

US 2007/0141392 A1 Jun. 21, 2007

(51) Int. Cl.
*H01L 51/54* (2006.01)
(52) U.S. Cl. ................. 428/690; 428/917; 313/504; 313/506
(58) Field of Classification Search ................. 313/504, 313/506
See application file for complete search history.

(56) References Cited

U.S. PATENT DOCUMENTS 4,356,429 A 10/1982 Tang (Continued)

FOREIGN PATENT DOCUMENTS

| JP | 07-150137 | 6/1995 |
|----|-----------|--------|
| JP | 2002-371271 | * 12/2002 |

OTHER PUBLICATIONS

Machine-generated translation for JP 2002-371271 A, published Dec. 2002.*

*Primary Examiner*—Dawn Garrett
(74) *Attorney, Agent, or Firm*—McKenna Long & Aldridge LLP

(57) ABSTRACT

Novel organic light emitting devices (OLEDs) with hexatriene derivative compounds that allow for the creation of brighter, more efficient, and more stable blue light emitting device. The class of compounds used in this novel class of OLEDs include compounds selected from the group consisting of general formulas:

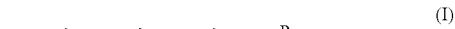

(I)

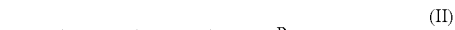

(II)

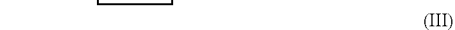

(III)

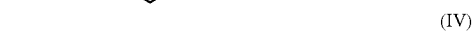

(IV)

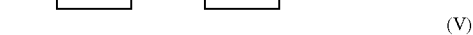

(V)

wherein R is a substituent selected from the group consisting of hydrogen, and substituted or unsubstituted aryl or heteroaryl, phenyl, tolyl, xylyl tert-butylphenyl, methoxyphenyl, 3,5-diphenylphenyl, 3,5-bis(p-tert-butylphenyl)phenyl, biphenyl, naphthyl, anthryl, phenylanthryl, diphenylanthryl, and halophenyl.

14 Claims, 1 Drawing Sheet

U.S. PATENT DOCUMENTS

| | | |
|---|---|---|
| 4,539,507 A | 9/1985 | VanSlyke et al. |
| 4,720,432 A | 1/1988 | VanSlyke et al. |
| 4,769,292 A | 9/1988 | Tang et al. |
| 5,121,029 A * | 6/1992 | Hosokawa et al. .......... 313/504 |
| 5,150,006 A | 9/1992 | Van Slyke et al. |
| 5,151,629 A | 9/1992 | VanSlyke |
| 5,409,783 A | 4/1995 | Tang et al. |
| 5,516,577 A | 5/1996 | Matsuura et al. |
| 5,846,666 A | 12/1998 | Hu et al. |
| 6,225,467 B1 | 5/2001 | Esteghamatian et al. |
| 6,229,012 B1 | 5/2001 | Hu et al. |
| 2002/0027415 A1 * | 3/2002 | Fujishita et al. ............. 313/504 |

* cited by examiner

HEXATRIENE DERIVATIVES FOR USE AS BLUE EMITTING MATERIALS FOR ORGANIC ELECTROLUMINESCENT DEVICES

BACKGROUND OF THE INVENTION

1. Field of the Invention

The present invention relates to organic electroluminescent (EL) devices, and more specifically, novel blue emitting organic EL devices with excellent performance characteristics. The organic EL devices of the present invention contain charge transport/luminescent materials comprised of a new class of organic compounds that may enable the aforementioned characteristics. These devices can be selected for use in flat-panel emissive display technologies, including TV screens, computer screens, and the like.

2. Discussion of the Related Art

Organic light emitting devices (OLEDs) represent a promising technology for display applications. For the production of a full-color EL display, it is desirable to have organic EL devices that are capable of providing uniform luminescence, saturated color in blue, green and red, and low driving voltages. A typical organic EL device can be comprised of a layer of an organic luminescent material conductively sandwiched between an anode, typically comprised of a transparent conductor, such as indium tin oxide, and a cathode, typically a low work function metal such as magnesium, calcium, aluminum, or the alloys thereof with other metals.

EL devices function on the principle that under an electric field, positive charges (holes) and negative charges (electrons) are respectively injected from the anode and cathode into the luminescent layer and undergo recombination to form excitonic states which subsequently emit light. Typically, for visual display applications, organic luminescent materials should provide a satisfactory color in the visible spectrum, normally with emission maxima at about 460, 550 and 630 nanometers for blue, green and red.

Several prior art organic EL devices have been constructed from a laminate of an organic luminescent material and electrodes of opposite polarity. These devices typically include a single crystal material, such as single crystal anthracene. However, these devices usually require excitation voltages on the order of 100 volts or greater.

Organic EL devices with a multilayer structure can be formed as a dual layer structure comprising one organic layer adjacent to the anode supporting hole transport, and another organic layer adjacent to the cathode supporting electron transport and acting as the organic luminescent zone of the device. Another alternative device configuration is comprised of three separate layers, a hole transport layer, a luminescent layer, and an electron transport layer, which layers are laminated in sequence and are sandwiched between an anode and a cathode.

Optionally, a fluorescent dopant material can be added to the emission zone or layer whereby the recombination of charges results in the excitation of the fluorescent dopant material.

In U.S. Pat. No. 4,539,507, the disclosure of which is fully incorporated herein by reference, there is disclosed an EL device formed of a conductive glass transparent anode, a hole transporting layer of 1,1-bis(4-p-tolylaminophenyl)cyclohexane, an electron transporting layer of 4,4'-bis(5,7-di-tert-pentyl-2-benzoxyzolyl)stilben, and an indium cathode. In U.S. Pat. No. 6,229,012, the disclosure of which is also fully incorporated herein by reference, there are illustrated devices with certain carbazoles.

U.S. Pat. No. 4,720,432, the disclosure of which is fully incorporated herein by reference, discloses an organic EL device comprising a dual-layer hole injecting and transporting zone, one layer being comprised of porphyrinic compounds supporting hole injection and the other layer being comprised of aromatic tertiary amine compounds supporting hole transport.

U.S. Pat. No. 4,769,292, the disclosure of which is fully incorporated herein by reference, discloses an EL device employing a luminescent zone comprised of an organic host material capable of sustaining hole-electron recombination and a fluorescent dye material capable of emitting light in response to energy released by hole-electron recombination. One host material disclosed in the '292 patent is an aluminum complex of 8-hydroxyquinoline, and more specifically, tris (8-hydroxyquinolinate)aluminum.

U.S. Pat. No. 5,409,783, the disclosure of which is fully incorporated herein by reference, discloses a red-emitting organic EL device containing a dopant of a tris(8-hydroxyquinolinate)aluminum with a red fluorescent dye. Further, blue-emitting organic EL devices are illustrated in, for example, U.S. Pat. Nos. 5,151,629 and 5,516,577, the disclosures of which are fully incorporated herein by reference.

For efficient light emission in an OLED a guest-host system is often used which helps with charge distribution within the OLED and combats the formation of exiplexes in the emitting material. A good guest-host system is one in which electrons and holes are transported through the guest-host matrix leading to complete charge recombination on the guest. It is desirable to have a band-gap of the guest that falls within the band-gap of the host.

While progress in organic EL research has elevated the potential of organic EL devices for widespread applications, the performance levels of a number of devices are still below expectations in several ways. While the creation of efficient and stable green and red fluorescent materials has advanced in the past years, the same is not true for blue emitting materials. Forming a good guest-host system for blue emitting organic EL devices is very difficult. This is due to the fact that blue light-emitting materials have a low affinity for the electron from the cathode in OLED devices. This has caused the performance of blue emitters to be inferior to that of green or red emitters. Accordingly, there is a need to develop stable blue emitters with high color purity.

SUMMARY OF THE INVENTION

Accordingly, the present invention is directed to hexatriene derivatives for use as blue emitting materials for organic electroluminescent devices that substantially obviates one or more of the problems due to limitations and disadvantages of the related art.

An advantage of the present invention is that it can provide OLED devices with improved blue light emitting efficiency and brightness.

Additional features and advantages of the invention will be set forth in the description which follows, and in part will be apparent from the description, or may be learned by practice of the invention.

To achieve these and other advantages and in accordance with the purpose of the present invention, as embodied and broadly described, an organic electroluminescent device that comprises an anode, a cathode, and a hexatriene compound selected from the group consisting of:

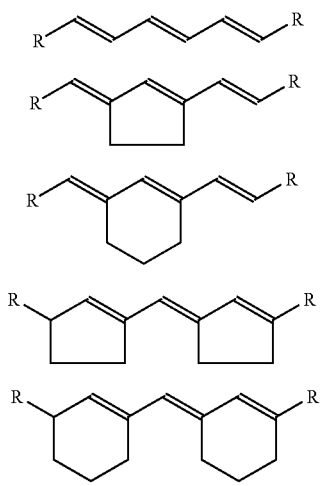

wherein R is a substituent selected from the group consisting of hydrogen, and substituted or unsubstituted aryl or heteroaryl, phenyl, tolyl, xylyl tert-butylphenyl, methoxyphenyl, 3,5-diphenylphenyl, 3,5-bis(p-tert-butylphenyl)phenyl, biphenyl, naphthyl, anthryl, phenylanthryl, diphenylanthryl, and halophenyl.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

The novel blue light emitting OLEDs according to the present invention comprise devices that use hexatriene derivative compounds in the light emitting region.

Figure 1:
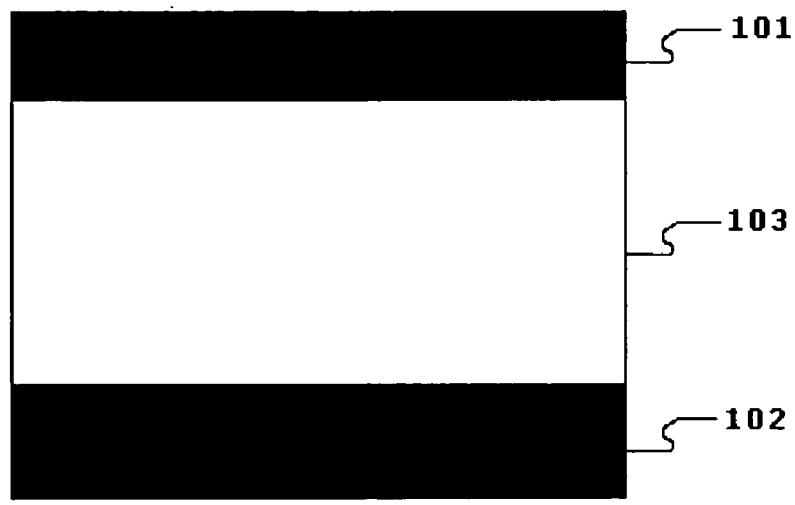
FIG. 1 is a general structure of an exemplary OLED according to an embodiment of the present invention.

As shown in FIG. 1, an exemplary embodiment of an OLED structure according to the present invention comprises a cathode 101, an anode 102, and a luminescent region 103 located between the cathode 101 and anode 102. The luminescent region 103 may comprise one or more layers. For example the luminescent region 103 may comprise one or more hole transporting and electron transporting layers, it may comprise buffer layers, and any other layer typically formed in this area of an OLED.

In an embodiment of the present invention, the luminescent region 103 comprises a compound selected from the group consisting of:

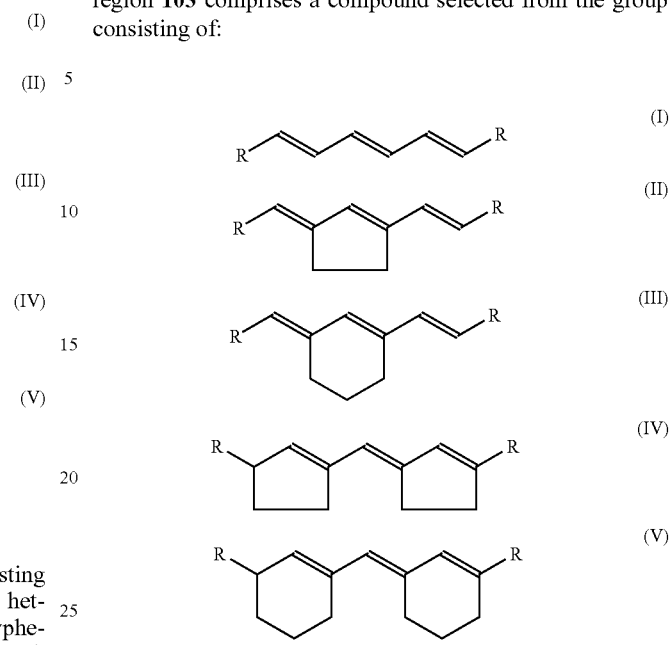

wherein R is a substituent selected from the group consisting of hydrogen, and substituted or unsubstituted aryl or heteroaryl, phenyl, tolyl, xylyl tert-butylphenyl, methoxyphenyl, 3,5-diphenylphenyl, 3,5-bis(p-tert-butylphenyl)phenyl, biphenyl, naphthyl, anthryl, phenylanthryl, diphenylanthryl, and halophenyl.

These type of compounds may be synthesized by conventional methods. One such method utilizes the Emmons-Horner reaction, for example, for the production of the 1,3,5-hexatriene unit. In an exemplary embodiment, starting materials, such as (E)-1,4-dichloro-2-butene and triethyl phosphite are heated together to give tetraethyl (E)-2-butene-1,4-diphosphonate. This phosphonate can then be reacted with an appropriate aldehyde in the presence of a base and result in 1,3,5-hexatriene derivative. Of course, other method of synthesis are possible.

The following diagram illustrates the exemplary process described above:

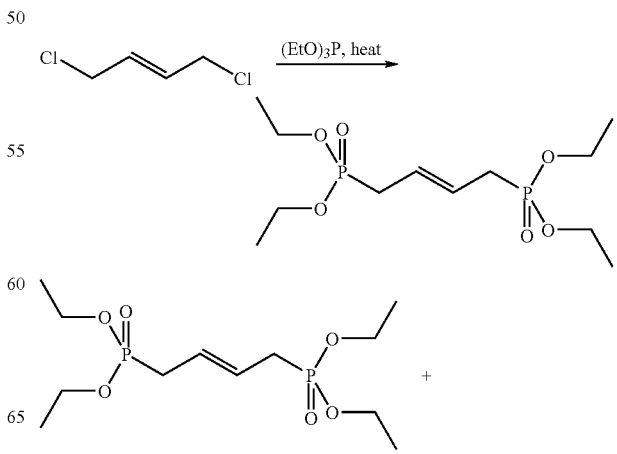

-continued

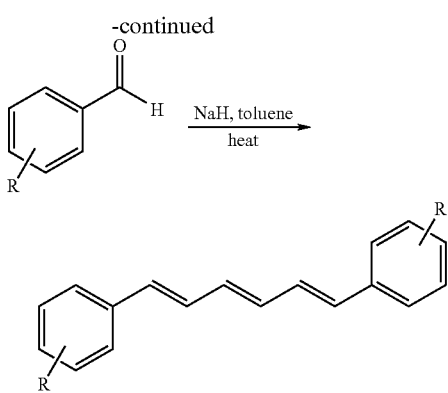

The hexatriene compounds according to the present invention have been shown to have large band gaps which allow for their use in blue light emitting OLEDs. In fact, these compounds, when used in the luminescent region, may be employed either as the light emitting layer itself, host materials to blue light emitting guest materials or as dopants, i.e. blue emitting guest materials.

In accordance with the scope of the present invention, three exemplary compounds that fall within the general aforesaid class of hexatriene compounds were prepared and their fluorescence was tested in solution (THF). Specifically, the three exemplary compounds are:

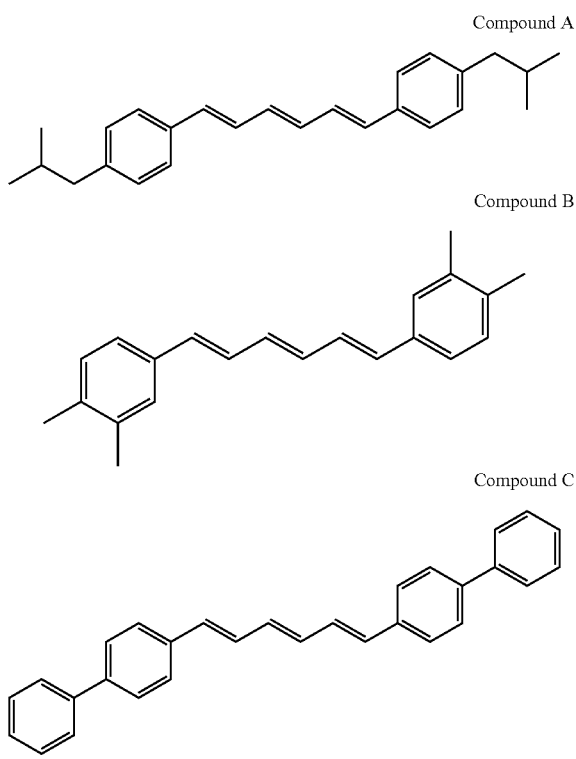

Figure 2:
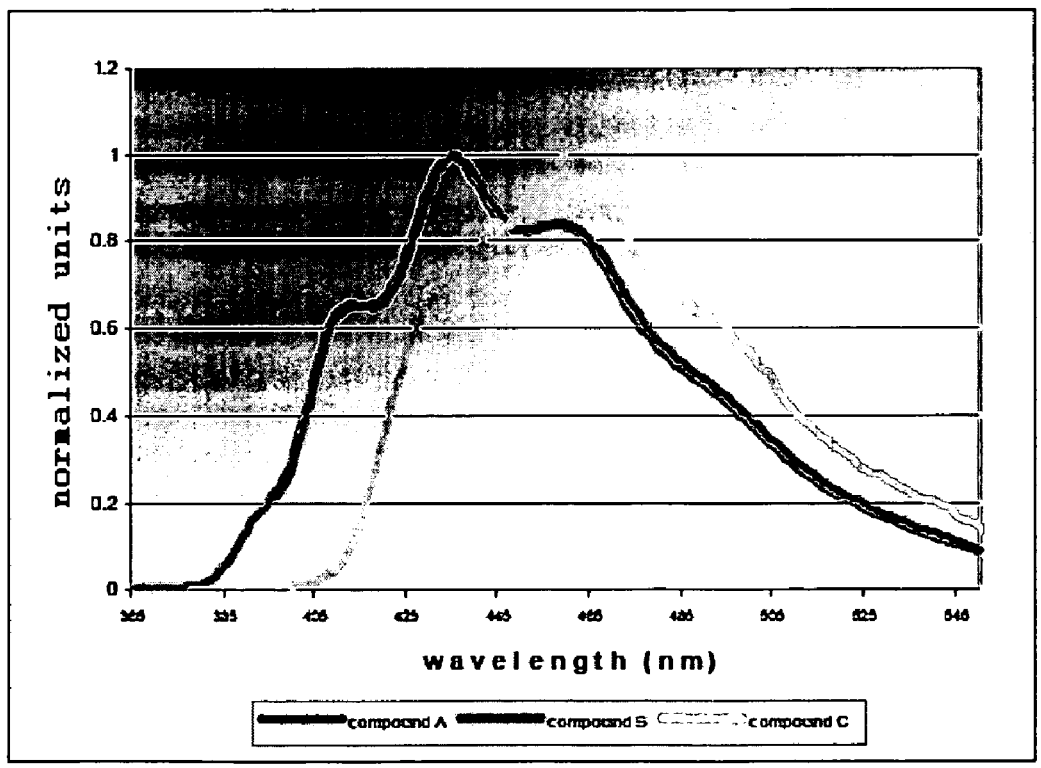
FIG. 2 shows the fluorescence spectra in solution of Compounds A, B, and C, according to exemplary embodiments of hexatriene compounds according to the present invention.

As shown in FIG. 2, all three compounds were found to produce a strong fluorescence in the blue region, i.e. between 400 and 500 nm.

As stated above, additional layers of materials may also be formed in the luminescent region 103. It is to be understood that it is within the scope of this invention to use any additional layer of material or material species in conjunction with the hexatriene compounds of the present invention.

Examples of additional layers or materials in the luminescent region may comprise ones used as hole transporting, hole injecting, electron transporting, electron injecting, buffer materials or layers and the like.

Any available hole-transporting material can be utilized in OLEDs that fall within the scope of the present invention. Exemplary hole-transporting materials may include polypyrrole, polyanliune, poly(phenylene vinylene), polythiophene, polyarylamine, PEDOT, and their derivatives, and known semiconductive organic materials; porphyrin derivatives such as 1,10,15,20-tetraphenyl-21H,23H-porphyrin copper (II); copper phthalocyanine, copper tetramethyl phthalocyanine; zinc phthalocyanine; titanium oxide phthalocyanine; magnesium phthalocyanine; and the like.

An additional class of hole transporting materials that can also be utilized are the aromatic tertiary amines. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-di-1-naphthyl-N,N'-diphenyl-1,1'-biphenyl-4,4'-diamine, mixtures thereof and the like. Another class of aromatic tertiary amines are polynuclear aromatic amines. Examples of these polynuclear aromatic amines include, but are not limited to, N,N-bis[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as, for example 4,4'-bis(9-carbazolyl)-1,1'-biphenyl and 4,4'-bis(3-methyl-9-carbazolyl)-1,1'-biphenyl, and the like.

A hole injection-assistant layers can also be added to exemplary embodiments of OLEDs according to the present invention. Such hole injection-assistant layers may be formed of various suitable known materials, such as aromatic tertiary amines such as those disclosed in U.S. Pat. No. 4,539,507, the disclosure of which is fully incorporated herein by reference. Suitable exemplary aromatic tertiary amines include, but are not limited to, bis(4-dimethylamino-2-methylphenyl)phenylmethane, N,N,N-tri(p-tolyl)amine, 1,1-bis(4-di-p-tolylaminophenyl)cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl-4,4'-diamine, N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine, N,N'-bis(1,1'-biphenyl-4-yl)-N,N'-diphenyl-1,1'-biphenyl-4,4'-diamine, N,N,N',N'-tetrakis(1,1'-biphenyl-4-yl)-1,1'-biphenyl-4,4'-diamine, N,N'-di-1-naphthyl-N,N'-diphenyl-1,1'-biphenyl-4,4'-diamine, N,N,N',N'-tetra-1-naphthyl-1,1'-biphenyl-4,4'-diamine, mixtures thereof and the like; polynuclear aromatic amines, examples of which include polynuclear aromatic amines like N,N-bis-[4'-(N-phenyl-N-m-tolylamino)-4-biphenylyl]aniline, N,N-bis-[4'-(N-phenyl-N-m-tolylamino)-4-biphenylyl]-m-toluidine, N,N-bis-[4'-(N-phenyl-N-m-tolylamino)-4-biphenylyl]-p-toluidine, N,N-bis-[4'-(N-phenyl-N-p-tolylamino)-4-biphenylyl]aniline, N,N-bis-[4'-(N-phenyl-N-p-tolylamino)-4-biphenylyl]-m-toluidine, N,N-bis-[4'-(N-phenyl-N-p-tolylamino)-4-biphenylyl]-p-toluidine, N,N-bis-[4'-(N-phenyl-N-p-chlorophenylamino)-4-biphenylyl]-m-toluidine, N,N-bis-[4'-(N-phenyl-N-m-chlorophenylamino)-4-biphenylyl]-m-toluidine, N,N-bis-[4'-(N-phenyl-N-m-chlorophenylamino)-4-biphenylyl]-p-toluidine, N,N-bis-[4'-(N-phenyl-N-m-tolylamino)-4-biphenylyl]-p-chloroaniline, N,N-bis-[4'-(N-phenyl-N-p-tolylamino)-4-biphenylyl]-m-chloroaniline, N,N-bis-[4'-(N-phenyl-N-m-tolylamino)-4-biphenylyl]-1-aminonaphthalene, mixtures thereof and the like.

Any suitable appropriate electron component may be selected for the electron transporting material. For blue emitting devices, it is desirable that the electron transport materials have a band gap in the blue region of, for example, from about 400 nanometers to about 550 nanometers. This layer can be formed by known methods, such as by vacuum deposition, and the layer thickness can be from about 1 nanometer to about 300 nanometers, and optionally from about 5 nanometers to about 100 nanometers.

Illustrative examples of the electron transporting compounds include quinolines, such as those disclosed in Japanese patent application 1995-150137, triazine compounds such as those disclosed in U.S. Pat. No. 6,225,467, and metal chelates of 8-hydroxyquinoline as disclosed in U.S. Pat. Nos. 4,539,507; 5,151,629, and 5,150,006, the disclosures of each of which are totally incorporated herein by reference.

Electron injection assistant materials may also optionally be employed, since they can be very useful in blue emitting devices. A primary purpose of this layer is to build up a stepwise energy level to assist electron injection from the cathode into the electron transport layer, thus reducing the driving voltage of the device.

A number of suitable electron transport material known in the art may be used for the electron injecting assistant. Illustrative examples of electron transport materials, which may be selected for use as the electron injection-assistant material include triazine compounds such as those disclosed in U.S. Pat. No. 6,225,467, the disclosure of which is totally incorporated herein by reference, and metal chelates of 8-hydroxyquinoline such as tris(8-hydroxyquinolinate)aluminum, a preferred one, tris(8-hydroxyquinolinate)gallium, bis(8-hydroxyquinolinate)magnesium, bis(8-hydroxyquinolinate)zinc, tris(5-methyl-8-hydroxyquinolinate)aluminum, tris(7-propyl-8-quinolinolato)aluminum, bis[benzo{f}-8-quinolinate]zinc, bis(10-hydroxybenzo[h]quinolinate)beryllium, and the like. Another class of preferred electron injecting compounds are the metal thioxinoid compounds, illustrated in U.S. Pat. No. 5,846,666, the disclosure of which is totally incorporated herein by reference. Illustrative examples of metal thioxinoid compounds include bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzol{f}-8-quinolinethiolato]zinc, and the like. Preferred are bis(8-quinolinethiolato)zinc, bis(8-quinolinethiolato)cadmium, tris(8-quinolinethiolato)gallium, tris(8-quinolinethiolato)indium and bis[benzo{f}-8-quinolinethiolato]zinc.

Buffer layers may also optionally be employed in exemplary OLEDs in accordance with the present invention. The functions of these layers are primarily to facilitate efficient injection of holes from the anode, and to improve the adhesion between the anode and the organic hole transporting layer, thus further improving the device operation stability in embodiments. Examples of buffer layer materials include conductive materials, such as polyanilines and their acid-doped forms, polythiophenes and their acid-doped forms, polypyrrole, poly(phenylene vinylene), amorphous graphite or carbon and the like. Preferred materials used in the buffer layer are hole transport molecules. Specific examples of such hole transport materials are porphyrin derivatives, such as those disclosed in U.S. Pat. No. 4,356,429, the disclosure of which is fully incorporated herein by reference, including 1,10,15,20-tetraphenyl-21H,23H-porphyrin copper (II), copper phthalocyanine, copper tetramethyl phthalocyanine, zinc phthalocyanine, titanium oxide phthalocyanine, magnesium phthalocyanine and the like. The buffer layer can be prepared by forming one of the buffer compounds into thin film by known methods, such as by vapor deposition or spin coating. The thickness of buffer layer thus formed is not particularly limited, and can be from, for example, about 5 nanometers to about 300 nanometers, and optionally from about 10 nanometers to about 100 nanometers.

The anode and cathode may also comprise one or more materials and/or one or more layers. Additionally, one or more substrates may be used in conjunction with the general OLED structure of the present invention.

Examplary anodes include positive charge injecting electrodes, such as indium tin oxide, tin oxide, gold, platinum, or other materials such as electrically conductive carbon, with a work function equal to, or greater than about 4 electron volts, and more specifically, from about 4 to about 6 electron volts. The thickness of the anode can range from about 1 to about 5,000 nanometers with the preferred range being dictated by the optical constants of the anode material. One exemplary range of thickness for the electrode, such as the anode, is from about 30 to about 100 nanometers.

The cathode can be constructed of any suitable appropriate metal, including high, for example from about 4 eV to about 6 eV, or a low work function component, such as metals with, for example, an eV of from about 2.5 eV to about 4.0 eV (electron volts). The cathode can be derived from a combination of a low work function metal (less than or equal to about 4 eV) and at least one other metal. Effective proportions of the low work function metal to the second or other metal are from, for example, about 0.1 percent to about 99.9 percent by weight. Illustrative examples of low work function metals include alkaline metals, such as lithium or sodium, Group 2A or alkaline earth metals, such as beryllium, magnesium, calcium, or barium, and Group III metals including rare earth metals and the actinide group metals, such as scandium, yttrium, lanthanum, cerium, europium, terbium, or actinium. Lithium, magnesium and calcium are in embodiments the preferred low work function metals.

Both the anode and the cathode can be of any appropriate forms, such as for example, wherein a thin conductive layer can be coated onto a light transmissive substrate, for example, a transparent or substantially transparent glass plate or plastic film. The EL device can include a light transmissive anode formed from tin oxide or indium tin oxide coated on a glass plate. Also, very thin, for example less than about 200 angstroms, like 95 to about 100 angstroms, light-transparent metallic anodes can be used, such as gold, palladium, and the like. In addition, transparent or semitransparent thin layers of conductive carbon or conjugated polymers, such as polyaniline, polypyrrole, and the like, can be used as anodes. Any light transmissive polymeric film can be employed as the substrate.

Illustrative examples of the supporting substrate include polymeric components, glass and the like, and polyesters like MYLAR™, polycarbonates, polyacrylates, polymethacrylates, polysulfones, quartz, and the like. Other substrates can also be selected provided the material chosen can effectively support the other layers, and that the substrate does not substantially interfere with the device functional performance. The thickness of the substrate can be, for example, from about 25 to about 5,000 microns or more, and for example, from about 50 to about 3,000 depending, for example on the structural demands of the device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescent device comprising:
   an anode,
   a cathode, and
   a hexatriene compound comprising the following formula:

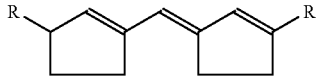

wherein R is a substituent selected from the group consisting of hydrogen, and substituted or unsubstituted aryl, or heteroaryl.

2. An organic electroluminescent device comprising:
   an anode,
   a cathode, and
   a hexatriene compound comprising the following formula:

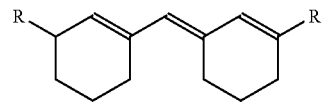

wherein R is a substituent selected from the group consisting of hydrogen, and substituted or unsubstituted aryl, or heteroaryl.

3. The organic electroluminescent device of claim 1, wherein the device is a blue light emitting device.

4. The organic electroluminescent device of claim 1, further comprising:
   a hole transporting layer; and
   an electron transporting layer.

5. The organic electroluminescent device of claim 1, wherein the hexatriene compound is a guest material.

6. The organic electroluminescent device of claim 1, further comprising a luminescent region wherein the hexatriene compound is a host material.

7. The organic electroluminescent device of claim 6, wherein the hexatriene compound in the luminescent region further comprises a blue light emitting guest material.

8. The organic electroluminescent device of claim 1, wherein the R group is selected from the group consisting of phenyl, tolyl, xylyl tert-butylphenyl, methoxyphenyl, 3,5-diphenylphenyl, 3,5-bis(p-tert-butylphenyl)phenyl, biphenyl, naphthyl, anthryl, phenylanthryl, diphenylanthryl, and halophenyl.

9. The organic electroluminescent device of claim 2, wherein the device is a blue light emitting device.

10. The organic electroluminescent device of claim 2, further comprising:
    a hole transporting layer; and
    an electron transporting layer.

11. The organic electroluminescent device of claim 2, wherein the hexatriene compound is a guest material.

12. The organic electroluminescent device of claim 2, further comprising a luminescent region wherein the hexatriene compound is a host material.

13. The organic electroluminescent device of claim 12, wherein the hexatriene compound in the luminescent region further comprises a blue light emitting guest material.

14. The organic electroluminescent device of claim 2, wherein the R group is selected from the group consisting of phenyl, tolyl, xylyl tert-butylphenyl, methoxyphenyl, 3,5-diphenylphenyl, 3,5-bis(p-tert-butylphenyl)phenyl, biphenyl, naphthyl, anthryl, phenylanthryl, diphenylanthryl, and halophenyl.

* * * * *